(12) United States Patent
Kawakubo et al.

(10) Patent No.: US 7,449,945 B2
(45) Date of Patent: Nov. 11, 2008

(54) PHASE DEMODULATOR AND PORTABLE TELEPHONE APPARATUS

(75) Inventors: Takashi Kawakubo, Yokohama (JP); Toshihiko Nagano, Kawasaki (JP); Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 522 days.

(21) Appl. No.: 11/299,852

(22) Filed: Dec. 12, 2005

(65) Prior Publication Data

US 2006/0132229 A1   Jun. 22, 2006

(30) Foreign Application Priority Data

Dec. 13, 2004   (JP)  ............... 2004-359790

(51) Int. Cl.
*H03D 3/00*   (2006.01)
(52) U.S. Cl. ...................... 329/345; 329/313
(58) Field of Classification Search ........... 329/345, 329/313, 346, 304
See application file for complete search history.

(56) References Cited

U.S. PATENT DOCUMENTS

| | | | | |
|---|---|---|---|---|
| 3,997,848 A | * | 12/1976 | Rippy | 329/346 |
| 4,174,505 A | * | 11/1979 | Querry | 375/283 |
| 2003/0118143 A1 | * | 6/2003 | Bellaouar et al. | 375/376 |
| 2003/0153286 A1 | * | 8/2003 | Bisanti et al. | 455/126 |

FOREIGN PATENT DOCUMENTS

JP   3052614   4/2000

* cited by examiner

*Primary Examiner*—Joseph Chang
(74) *Attorney, Agent, or Firm*—Amin, Turocy & Calvin, LLP

(57) ABSTRACT

A phase demodulator has a high frequency amplifier which amplifies a received signal modulated by phase, a voltage control oscillator which conducts oscillation operation in tune with the received signal amplified by the high frequency amplifier, a phase comparator which detects a phase difference between an output signal of the voltage control oscillator and a reference oscillation signal, and a demodulator which conducts demodulation process based on the phase difference.

20 Claims, 6 Drawing Sheets

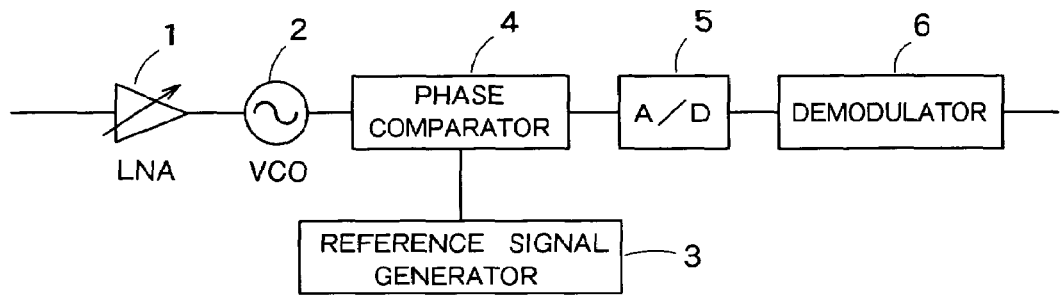
F I G. 1
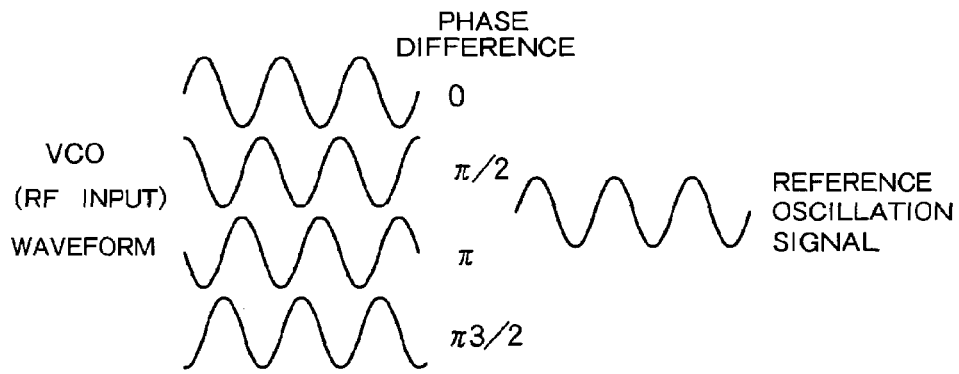
F I G. 2
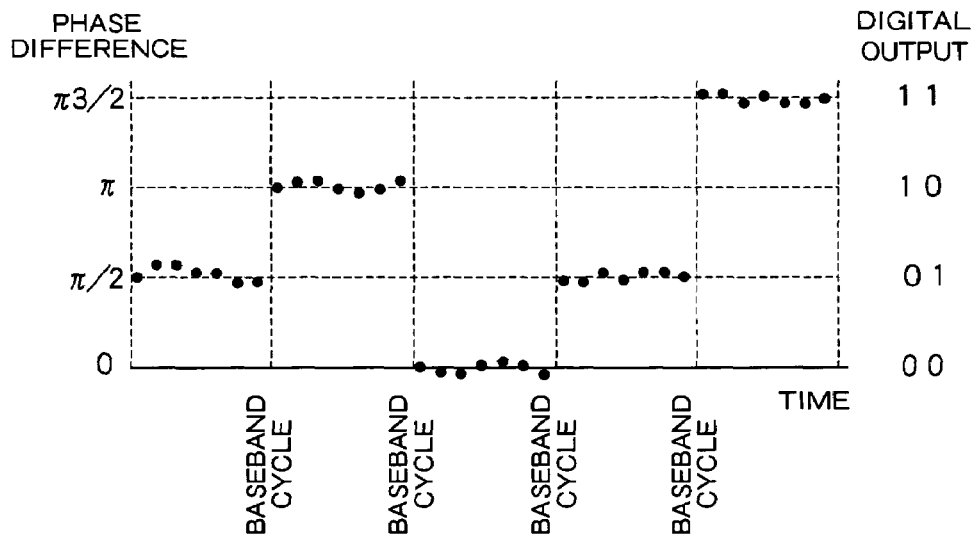
F I G. 3

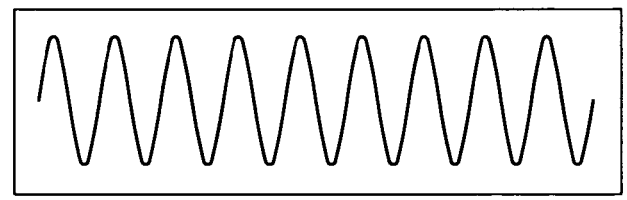
F I G. 4A
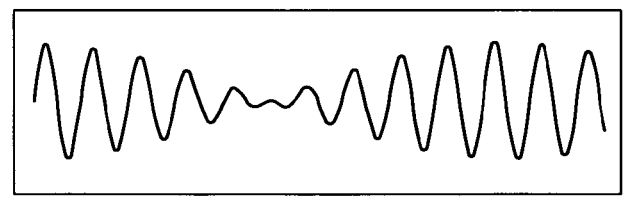
F I G. 4B
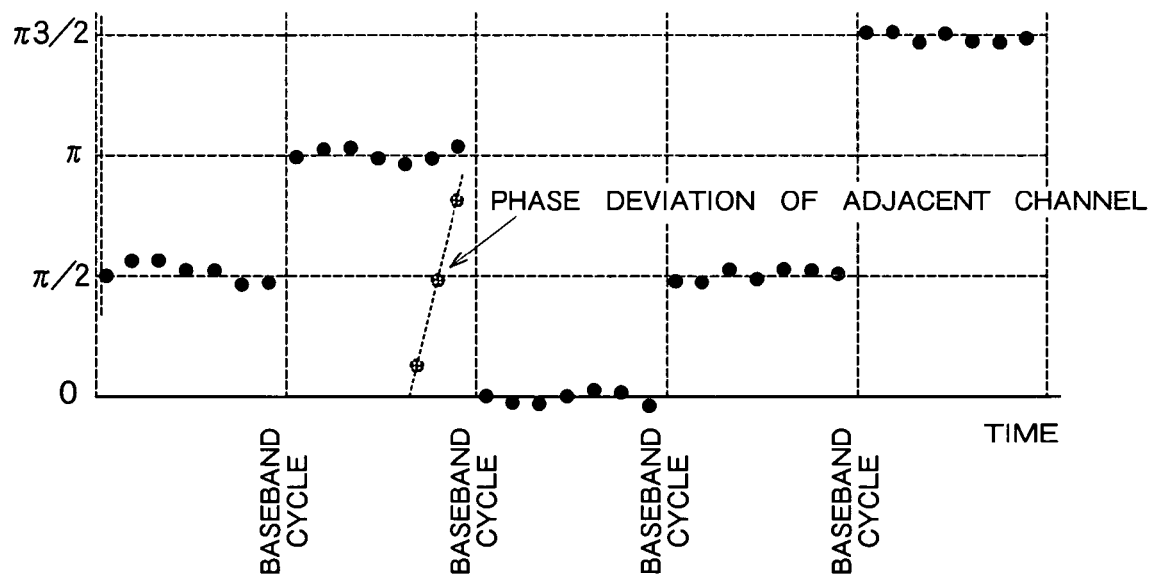
F I G. 5

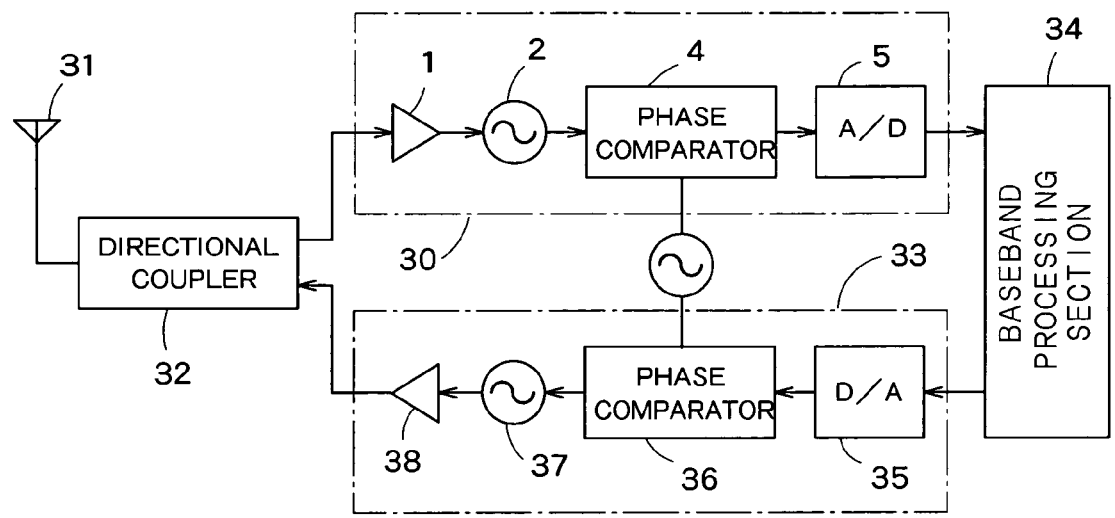
F I G. 9

PHASE DEMODULATOR AND PORTABLE TELEPHONE APPARATUS

CROSS REFERENCE TO RELATED APPLICATIONS

This application is based upon and claims the benefit of priority from the prior Japanese Patent Application No. 2004-359790, filed on Dec. 13, 2004, the entire contents of which are incorporated herein by reference.

BACKGROUND OF THE INVENTION

1. Field of the Invention

The present invention relates to a phase demodulator and a portable telephone apparatus which demodulate phase-modulated received signals.

2. Related Art

Many types of QPSK demodulation systems are known which are used in radio communication devices such as portable telephones. Most of them adopt an orthogonal demodulation method.

There are various types of orthogonal demodulation systems. One prevailing system is a superheterodyne system. In this system, a carrier-frequency signal that has passed through a bandpass filter and has been amplified with a low noise amplifier (LNA) is mixed with a signal from a local oscillator by a down converter to convert the signal into an intermediate frequency (IF) signal with a lower frequency.

The IF signal is inputted to a bandpass filter to select a targeted channel frequency and is amplified by a valuable gain amplifier (VGA). An orthogonal demodulator performs demodulation processes for two systems orthogonal to each other (different in phase by 90 degrees). In each system, the received signal is mixed with an output of a local oscillator for generating IF signal to convert the received signal into a baseband frequency. Subsequently the frequency-converted signal passes through a lowpass filter to be digitized by an A/D converter, and a demodulation process is conducted.

Recently, a direct conversion system has been popular in a GSM cellular phone system and the like. In the direct conversion system, the signals of a carrier frequency that have passed through a bandpass filter and been amplified by the LNA are branched into two portions by the orthogonal demodulator. Those branched signals are mixed with the orthogonal output of the local oscillator and directly converted into the baseband frequency. Subsequently a targeted channel frequency is selected by a lowpass filter, amplified with the VGA, digitized by the A/D converter, and then the demodulation process is conducted (refer to Japanese Patent Publication No. 3052614).

Both the superhererodyne and the direct conversion systems have a problem in that enormous numbers of circuits are necessary, i.e. two types of demodulation processes for the received signal by using the orthogonal demodulator, the local oscillator for generating the high frequency reference signal, the mixer and the down converter for converting the high frequency received signal to the IF signal, the bandpass filer for selecting the received channel, the A/D converter for conducting A/D conversion, the demodulator and the like are necessary.

A system, as a future wireless system, has been studied which directly conducts A/D converter by over-sampling in a state of a carrier frequency, selects the channel signal by digital process and conducts the demodulation process. There is a problem in that the use of such a system will be unpractical in near future, because the A/D conversion performed by over-sampling at a very high carrier frequency such as 800 MHz to 2 GHz requires a very high speed A/D converter, and power consumption will increase to more than several tens of Watts or more.

SUMMARY OF THE INVENTION

According to one embodiment of the present invention, a phase demodulator comprising:

a high frequency amplifier which amplifies a received signal modulated by phase;

a voltage control oscillator which conducts oscillation operation in tune with the received signal amplified by the high frequency amplifier;

a phase comparator which detects a phase difference between an output signal of the voltage control oscillator and a reference oscillation signal; and a demodulator which conducts demodulation process based on the phase difference.

According to one embodiment of the present invention, a portable telephone apparatus comprising:

an antenna which sends and receives a radio signal modulated by phase;

a receiver which conducts a reception process of a received signal received by the antenna; and a transmitter which conducts a transmission process of a transmission signal transmitted by the antenna, wherein the receiver includes:

a high frequency amplifier which amplifies a received signal modulated by phase;

a voltage control oscillator which conducts oscillation operation in tune with the received signal amplified by the high frequency amplifier;

a phase comparator which detects a phase difference between an output signal of the voltage control oscillator and a reference oscillation signal; and a demodulator which conducts demodulation process based on the phase difference.

BRIEF DESCRIPTION OF THE DRAWINGS

FIG. 1 is a block diagram showing a schematic configuration of a phase demodulator according to a first embodiment of the present invention.

FIG. 2 is a waveform chart showing waveforms of received signals and the reference oscillation signal.

FIG. 3 is a waveform chart explaining an operation principle of the phase demodulator shown in FIG. 1.

FIGS. 4A and 4B diagrams showing one example of the oscillation signal waveform of the VCO 2 without and with interference waves, respectively.

FIG. 5 is a diagram showing outputs from the A/D converter 5 in the case where adjacent-channel interference waves are contained in the received signal.

FIG. 9 is a block diagram showing a schematic configuration of a portable telephone apparatus having a phase demodulator with the same configuration as that of the first and second embodiments.

DETAILED DESCRIPTION OF THE INVENTION

Figure 6:
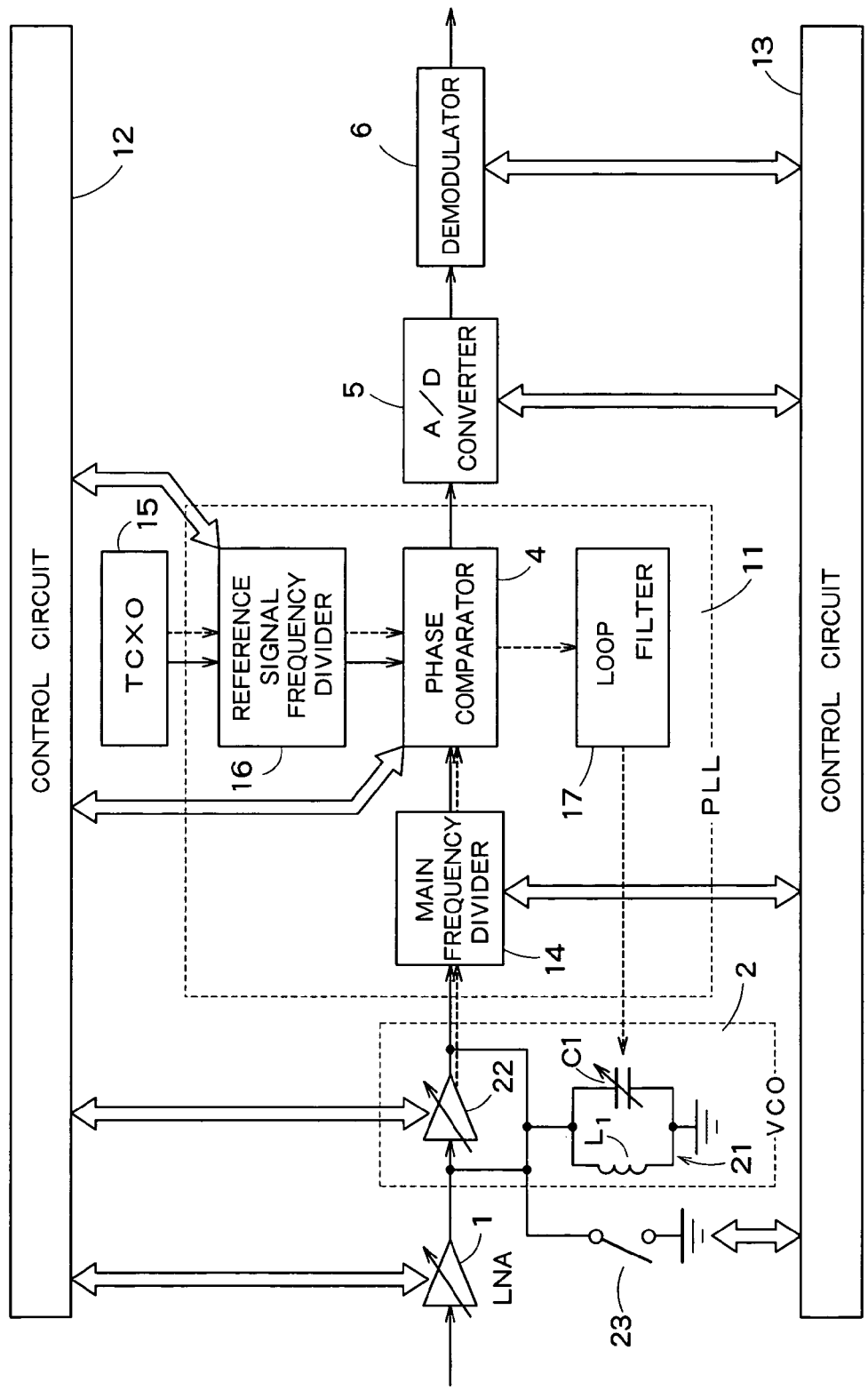
FIG. 6 is a block diagram showing a concrete configuration of the phase demodulator according to the present embodiment.

One embodiment of the present invention is described below with reference to the drawings.

First Embodiment

FIG. 1 is a block diagram showing a schematic configuration of a phase demodulator according to a first embodiment of the present invention. The phase demodulator shown in FIG. 1 includes a low noise amplifier (LNA) 1 for amplifying phase-modulated received signals, a voltage controlled oscillator (VCO) 2 that oscillates in tune with an output signal of the LNA 1, a reference signal generator 3 for generating a reference oscillation signal, a phase comparator 4 for detecting a phase difference between the oscillation signal from VCO 2 and the reference oscillation signal, an A/D converter 5 for conducting A/D conversion of the detected phase difference, and a demodulator 6 for conducting demodulation process based on the A/D converted phase difference.

The phase demodulator shown in FIG. 1 includes the VCO 2 for directly detecting a phase of the received signal, instead of a conventional orthogonal demodulator. The VCO 2 is controlled to oscillate at a specific frequency component contained in the received signal outputted from the LNA 1. Practically, however, the received signals contain interference waves, so that the oscillation signal of the VCO 2 contains beat components.

FIG. 2 is a waveform chart showing waveforms of received signals and the reference oscillation signal. FIG. 3 is a waveform chart explaining an operation principle of the phase demodulator shown in FIG. 1. Received signals in a QPSK scheme are modulated to four types of signals (with phase differences of 0, π/2, π, 3π/2) different in phase by 90 degrees from each other. Thus the oscillation signal of the VCO 2 also contains four types of signals different in phase as shown on the left of FIG. 2.

The phase comparator 4 detects a phase difference between the oscillation signal from the VCO 2 and the reference oscillation signal. Therefore, the phase comparator 4 outputs four types of signals different in phase. The output of the phase comparator 4 is analog-to-digital converted with the A/D converter 5 every predetermined period of time. The A/D converter 5 conducts A/D conversion of the output of the phase comparator 4, for example, at plotted points in FIG. 3. When no interference wave exists, four different types of signals are obtained from the outputs of the A/D converter 5 as shown in FIG. 3. The demodulator 6 conducts the demodulation process based on the outputs of the A/D converter 5, thereby generating two-bit digital signals 00, 01, 10, and 11 as shown on the right of FIG. 3.

The period (sampling interval) at which the A/D converter 5 performs an A/D conversion may be equal to or shorter than that of the carrier frequency (baseband frequency) of a received signal.

As described later, the VCO 2 has a tank circuit including an inductor and a capacitor, and an amplifier circuit. The VCO 2 can have a large Q-factor by adjusting a loop gain and the like. Thus the VCO 2 does not amplify interference waves largely different from a targeted channel frequency in a resonant manner. That is to say, the VCO 2 has a frequency selectivity according to the Q-factor and a filter function to select the targeted channel frequency.

When an interference wave with a frequency close to a targeted channel frequency is inputted into the VCO 2, on the other hand, an amplitude component due to an interference wave occurs in the oscillation signal of the VCO 2 according to the Q-factor and the frequency difference.

FIGS. 4A and 4B show one example of the oscillation signal waveform of the VCO 2 without and with interference waves, respectively. When the received signals do not contain the interference waves, as shown in FIG. 4A, the VCO 2 resonates at a constant amplitude, the phase of the oscillation signal is constant within the baseband cycle. As shown in FIG. 3, the phase comparator 4 outputs signals approximately equal in phase within each baseband cycle.

On the other hand, when adjacent-channel signal components get mixed with the received signals as interference waves, resonating waveforms are obtained in which beat components whose cycle equal to a frequency difference between the resonance frequency of the VCO 2 and adjacent-channel frequency is contained. The phases of the resonating waveforms vary with the frequency difference.

FIG. 5 shows outputs from the A/D converter 5 in the case where adjacent-channel interference waves are contained in the received signal. When the oscillation signal of the VCO 2 contains beat components, a phase difference corresponding to a frequency difference between the frequency of an interference wave and the oscillation signal of the VCO 2 varies with an angular velocity corresponding to the frequency difference, the output of the A/D converter 5 becomes irregular partially, thereby preventing the demodulator 6 from conducting the demodulation process correctly.

As a method of eliminating such an interference wave of the adjacent channel, by using a method of passing phase-difference signals outputted from the phase comparator 4 through a low-pass filter to eliminate influence of the adjacent channel, or a method of detecting mean values or frequency distribution of the phase-difference signals to eliminate influence of the adjacent channel, the selected channel signal is separated from the adjacent channel signal, and it is possible to determine a phase of the selective channel to conduct the demodulation process.

FIG. 6 is a block diagram showing a concrete configuration of the phase demodulator according to the present embodiment. In FIG. 6, the same reference symbols are given to the same components in FIG. 1. Different points will be mainly described as follows.

The phase demodulator shown in FIG. 6 includes an LNA 1, VCO 2, PLL circuit 11, A/D converter 5, demodulator 6, and control circuits 12 and 13. The control circuits 12 and 13 may be integrated into one system.

The PLL circuit 11 has a main frequency divider 14 for dividing the frequency of the oscillation signal of the VCO, a reference-signal frequency divider 16 for dividing the frequency of the reference frequency signal generated by a temperature-compensated crystal oscillator (TCXO) 15, the phase comparator 4 shown in FIG. 1 for detecting a phase difference between both divided signals, and a loop filter 17 for extracting a predetermined frequency component from the detected phase difference signal.

The VCO 2 is composed, for example, of a Colpitts circuit which has a tank circuit 21 including an inductor L1 and a capacitor C1 connected in parallel to each other, an amplifier circuit 22 for amplifying the resonance signal of the tank circuit 21, and a switch 23 capable of grounding the tank circuit 21 in synchronization with a baseband cycle of a received signal. The capacitor C1 inside of the tank circuit 21 is for example a variable capacitance diode. More specifically, a tunable capacitor fabricated based on microelectromechanical system (MEMS) technology with a high Q-factor and a wide variation in capacitance is used as a variable capacitance diode.

The control circuit 12 adjusts the gains of the LNA 1 and the amplifier circuit 22 in the VCO 2, controls the operation of the phase comparator 4, and sets a division ratio of the reference signal frequency divider 16. The control circuit 13 controls On/Off of the switch in the VCO 2, sets a division ratio of the main frequency divider 14, and controls the operation of the A/D converter 5 and the demodulator 6.

Figure 7:
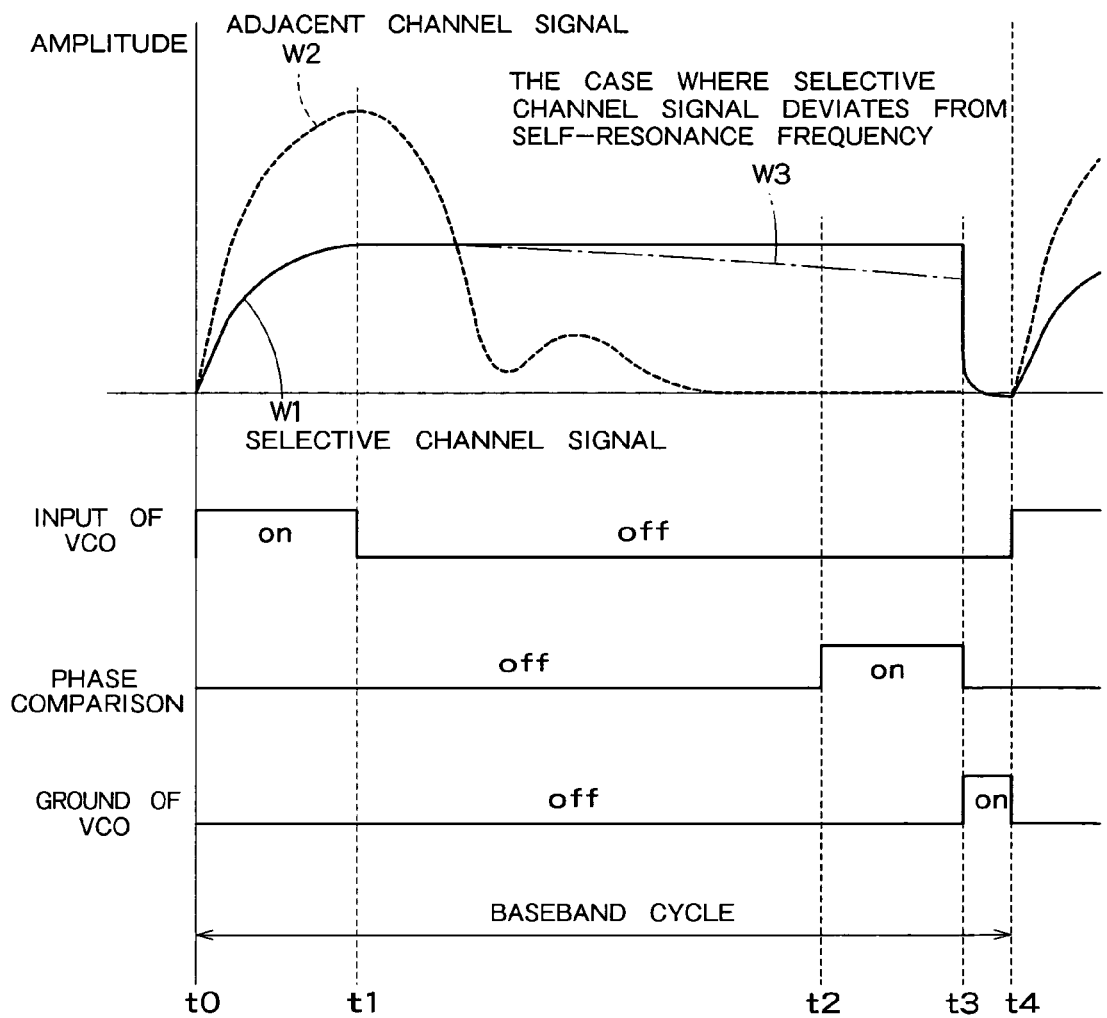
FIG. 7 shows signal waveforms of the phase demodulator shown in FIG. 6.

FIG. 7 shows signal waveforms of the phase demodulator shown in FIG. 6. The operation of the phase demodulator in FIG. 6 is described below based on that figure. Periods t0 to t4 shown in FIG. 7 represent the baseband cycles of received signals, and the periods t0 to t4 are repeated. Firstly the LNA 1 is operated with its gain increased within the period t0 to t1, whereby received signals with an antenna not shown are amplified by and outputted from the LNA 1. The oscillation frequency of the VCO 2 is preset to a selected channel frequency contained in the received signals. Therefore, VCO 2 resonates at the selected channel frequency component contained in the received signals. When interference waves are not contained in the VCO 2, the oscillation signal of the VCO 2 is constant in amplitude (the waveform w1 in solid line in FIG. 7).

When adjacent-channel interference waves are contained in received signals, on the other hand, beats whose cycle is frequency difference are generated, and a waveform w2 shown in dotted line in FIG. 7 is expressed by the output of the VCO 2. As the waveform w2 shows, beat components contained in the oscillation signal of the VCO 2 gradually attenuate with time and soon reduce to zero.

In the present embodiment, the gain of LNA 1 is set to zero at a time t1 so that the LNA 1 does not output received signal. Consequently, even if adjacent-channel signal components are contained in the received signal, all beat components of the oscillation signal of the VCO 2 attenuate and reduce to zero within the baseband cycle.

Although factors other than those due to the adjacent-channel signal components can produce various distortions and nonlinear components in the tank circuit 21 of a practical VCO 2, beats generated by such distortions and nonlinear components will completely attenuate within one to two periods of the beat signal waveform.

Then, in the present embodiment, the phase comparator 4 is operated to detect a phase difference (at the period t2 to t3 in FIG. 7) after beats contained in the oscillation signal of the VCO 2 have attenuated and disappeared. After the phase difference has been detected, the tank circuit 21 in the VCO 2 is grounded for the present (at the period t3 to t4), thereby causing the tank circuit 21 to temporarily stop a resonance operation. As describe above, because the oscillation signal is produced with resonance of the tank circuit 21 after the tank circuit 21 has been reset for each baseband cycle, the VCO 2 becomes independent from the influence of the previous baseband cycle.

Timing will be described below with an example of the W-CDMA system. In this instance, a baseband frequency is 2 MHz, one cycle being 500 ns, a frequency difference with an adjacent channel being 5 MHz, and a beat cycle being 200 ns. Therefore, by turning on the input of the VCO 2, for example, for about 50 ns to 100 ns and then turning off it, it is possible to attenuate the amplitude of the adjacent-channel generating the beat component.

The loop filter 17 inside the PLL circuit 11 controls the oscillation frequency of the VCO 2 according to the phase difference detected by the phase comparator 4 within the period when the receiving operation is not conducted. In FIG. 6, paths denoted by the dotted arrows in the PLL circuit 11 shows the flow of signals in the case where the oscillation frequency of the VCO 2 is controlled by a PLL (Phase Locked Loop) within the period when the receiving operation is not conducted.

Such PLL control permits the self-resonant frequency of the VCO 2 to be tuned to a desired selected channel frequency contained in the received signals. During the receiving operation, however, the self-resonant frequency cannot be tuned by the PLL control because the VCO 2 oscillates according to the received signal.

As stated above, in the first embodiment, an orthogonal demodulator is unnecessary because digital demodulation is performed by the phase difference between the phase of the signal oscillated at a selected channel frequency by the VCO 2 into which received signals are inputted and that of the reference oscillation signal, thereby largely downsizing the circuit configuration. If adjacent-channel signal components are contained in received signals, the beats may occur in the oscillation signal of the VCO 2. However, according to this embodiment, detection of the phase difference is conducted after the beats have attenuated. Therefore, it is possible to detect the phase difference without being influenced by the interference wave such as the adjacent channel signal, thereby improving accuracy of the digital demodulation.

Second Embodiment

A second embodiment is the new addition of a tuning function of the self-resonant frequency of the VCO 2 during a signal receiving operation to the first embodiment.

A single dashed line w3 in FIG. 7 shows an example where the self-resonant frequency of the VCO 2 deviates from the selected channel frequency. Deviation in frequency makes the amplitude of oscillation signal of the VCO 2 small. Then, in the present embodiment, the amplitude of the oscillation signal of the VCO 2 is detected and the VCO 2 is adjusted so that the amplitude is maximized.

Figure 8:
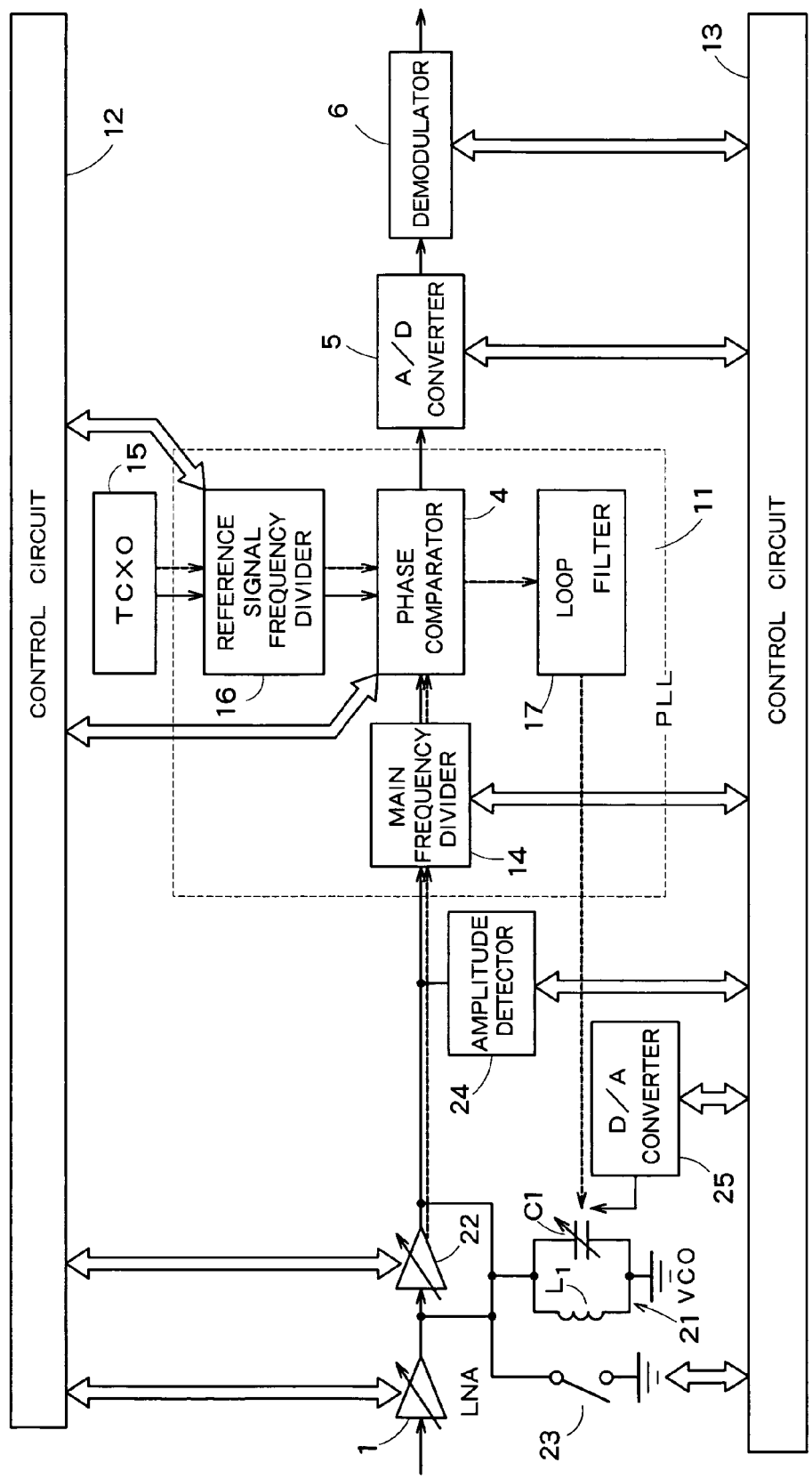
FIG. 8 is a block diagram showing the internal configuration of the phase demodulator according to the second embodiment of the present invention.

FIG. 8 is a block diagram showing the internal configuration of the phase demodulator according to the second embodiment of the present invention. In FIG. 8, the same reference symbols are given to composing parts common to those in FIG. 6. The discussion below is focused on the differences from in FIG. 6.

The phase demodulator shown in FIG. 8 includes an amplitude detector 24 for detecting the amplitude of oscillation signal of the VCO 2 and a D/A converter 25 for correcting the self-resonant frequency of the VCO 2 based upon the detected amplitude information. The amplitude detector 24 and D/A converter 25 are connected to the control circuit 13.

The D/A converter 25 variably controls for example the capacitance of the capacitor C1 forming the tank circuit 21 in the VCO 2. Change in the output voltage of the D/A converter 25 causes the capacitance of the capacitor C1 to change, thereby changing the oscillation frequency of the VCO 2.

A series of voltages slightly deviated by the D/A converter 25 is supplied to the VCO 2 during the receiving operation. The oscillation frequency and amplitude of the VCO 2 change for each voltage. The control circuit 12 regulates the VCO 2 to maximize the amplitude of the oscillation signal of the thereof. Therefore, it is possible to tune the self-resonant frequency of the VCO 2 to the selected channel frequency.

In that manner, according to the second embodiment, the VCO 2 is regulated by detecting the amplitude of the oscillation signal thereof to maximum the amplitude during the receiving operation, so that the self-resonant frequency of the VCO 2 can be accurately tuned to the selected channel frequency.

Other Embodiment

The phase demodulators described in the above first and second embodiments may be used in for example a portable telephone apparatus.

FIG. 9 is a block diagram showing a schematic configuration of a portable telephone apparatus having a phase demodulator with the same configuration as that of the first and second embodiments. The portable telephone apparatus shown in FIG. 9 has an antenna 31, a duplexer 32 for switching transmission and reception, a phase demodulator 30 having a similar configuration as that of the first and second embodiments, a transmitting section 33, and a baseband processing section 34. The transmitting section 33 has a D/A converter 35 for converting transmitted signals outputted from the baseband processing section 34 to analog signals, a phase modulator 36, a VCO 37, and an amplitude modulator 38. The phase modulator 36 performs a phase modulation using the same reference signal generator 3 as in the phase demodulator 30.

As described above, by using the phase demodulator according to the present embodiment in the portable telephone apparatus, it is possible to simplify the circuit configuration of the portable telephone apparatus, thereby reducing size and power consumption thereof.

What is claimed is:

1. A phase demodulator comprising:
a high frequency amplifier which amplifies a received signal modulated by phase;
a voltage control oscillator which conducts oscillation operation in tune with the received signal amplified by the high frequency amplifier;
a phase comparator which detects a phase difference between an output signal of the voltage control oscillator and a reference oscillation signal; and
a demodulator which conducts demodulation process based on the phase difference.

2. A phase demodulator according to claim 1,
wherein the voltage control oscillator is controlled to oscillate with a certain frequency component included in the received signal outputted from the high frequency amplifier.

3. A phase demodulator according to claim 1, further comprising:
a first control unit configured to allow the high frequency amplifier to output the received signal during a first period in each baseband cycle of the received signal;
a second control unit configured to operate the phase comparator during a second period subsequent to the first period in each baseband; and
a third control unit configured to suspend operation of the voltage control oscillator during a third period subsequent to the second period in each baseband.

4. A phase demodulator according to claim 3,
wherein the second control unit operates the phase comparator after a beat signal due to an adjacent channel of a selective channel frequency included in the output signal of the voltage control oscillator attenuates.

5. A phase demodulator according to claim 3,
wherein the first, second and third control units conduct the respective operations when the demodulator does not conduct the demodulation process.

6. A phase demodulator according to claim 5, further comprising:
a PLL circuit which adjusts the oscillation frequency of the voltage control oscillator based on the phase difference detected by the phase detector during a period when reception operation is not conducted.

7. A phase demodulator according to claim 6,
wherein the PLL circuit includes:
a first frequency divider which divides an output frequency of the voltage control oscillator; and
a second frequency divider which divides a frequency of the reference oscillation signal,
the phase comparator detecting the phase difference between the output signal of the first frequency divider and the output signal of the second frequency divider.

8. A phase demodulator according to claim 1, further comprising:
an amplitude detector which detects an amplitude of the output signal of the voltage control oscillator during a received operation period; and
a fourth control unit configured to control the oscillation frequency of the voltage control oscillator to maximize the output amplitude of the voltage control oscillator based on the amplitude detected by the amplitude detector.

9. A phase demodulator according to claim 8,
wherein the fourth control unit controls the oscillation frequency of the voltage control oscillator when the demodulator does not conduct the demodulation operation.

10. A phase demodulator according to claim 1, further comprising an A/D converter which converts the output signal of the phase comparator to a digital signal,
wherein the demodulator conducts the demodulation process based on the digital signal.

11. A portable telephone apparatus, comprising:
an antenna which sends and receives a radio signal modulated by phase;
a receiver which conducts a reception process of a received signal received by the antenna; and
a transmitter which conducts a transmission process of a transmission signal transmitted by the antenna,
wherein the receiver includes:
a high frequency amplifier which amplifies a received signal modulated by phase;
a voltage control oscillator which conducts oscillation operation in tune with the received signal amplified by the high frequency amplifier;
a phase comparator which detects a phase difference between an output signal of the voltage control oscillator and a reference oscillation signal; and
a demodulator which conducts demodulation process based on the phase difference.

12. A portable telephone apparatus according to claim 11,
wherein the voltage control oscillator is controlled to oscillate with a certain frequency component included in the received signal outputted from the high frequency amplifier.

13. A portable telephone apparatus according to claim 11,
wherein the receiver further includes:
a first control unit configured to allow the high frequency amplifier to output the received signal during a first period in each baseband cycle of the received signal;
a second control unit configured to operate the phase comparator during a second period subsequent to the first period in each baseband; and
a third control unit configured to suspend operation of the voltage control oscillator during a third period subsequent to the second period in each baseband.

14. A portable telephone apparatus according to claim 13, wherein the second control unit operates the phase comparator after a beat signal due to an adjacent channel of a selective channel frequency included in the output signal of the voltage control oscillator attenuates.

15. A portable telephone apparatus according to claim 13, wherein the first, second and third control units conduct the respective operations when the demodulator does not conduct the demodulation process.

16. A portable telephone apparatus according to claim 11, wherein the receiver further includes:

a PLL circuit which adjusts the oscillation frequency of the voltage control oscillator based on the phase difference detected by the phase detector during a period when reception operation is not conducted.

17. A portable telephone apparatus according to claim 16, wherein the PLL circuit includes:

a first frequency divider which divides an output frequency of the voltage control oscillator; and a second frequency divider which divides a frequency of the reference oscillation signal, the phase comparator detecting the phase difference between the output signal of the first frequency divider and the output signal of the second frequency divider.

18. A portable telephone apparatus according to claim 11, wherein the receiver further includes:

an amplitude detector which detects an amplitude of the output signal of the voltage control oscillator during a received operation period; and a fourth control unit configured to control the oscillation frequency of the voltage control oscillator to maximize the output amplitude of the voltage control oscillator based on the amplitude detected by the amplitude detector.

19. A portable telephone apparatus according to claim 18, wherein the fourth control unit controls the oscillation frequency of the voltage control oscillator when the demodulator does not conduct the demodulation operation.

20. A portable telephone apparatus according to claim 11, wherein the receiver further includes an A/D converter which converts the output signal of the phase comparator to a digital signal, the demodulator conducting the demodulation process based on the digital signal.

\* \* \* \* \*